United States Patent [19]
Yang et al.

[11] Patent Number: 6,066,538
[45] Date of Patent: May 23, 2000

[54] METHODS AND APPARATUS FOR FORMING INTEGRATED CIRCUIT CAPACITORS HAVING COMPOSITE OXIDE-NITRIDE-OXIDE DIELECTRIC LAYERS THEREIN

[75] Inventors: Chang-yip Yang; Tae-myoung Park; Tae-jin Lim, all of Kyungki-do, Rep. of Korea

[73] Assignee: Samsung Electronics Co., Ltd., Rep. of Korea

[21] Appl. No.: 09/048,393

[22] Filed: Mar. 26, 1998

[30] Foreign Application Priority Data

Apr. 16, 1997 [KR]  Rep. of Korea ................ 97-14049

[51] Int. Cl.$^7$ ................................................ H01L 21/20
[52] U.S. Cl. ............................................. 438/393; 438/396
[58] Field of Search .................................... 438/240, 239, 438/386, 393, 396

[56] References Cited

U.S. PATENT DOCUMENTS

| | | | |
|---|---|---|---|
| 5,185,689 | 2/1993 | Maniar | 361/313 |
| 5,501,999 | 3/1996 | Park | 437/52 |
| 5,534,457 | 7/1996 | Tseng et al. | 437/52 |
| 5,552,334 | 9/1996 | Tseng | 437/52 |
| 5,607,874 | 3/1997 | Wang et al. | 437/52 |
| 5,686,337 | 11/1997 | Koh et al. | 437/52 |
| 5,702,989 | 12/1997 | Wang et al. | 438/397 |
| 5,910,218 | 6/1999 | Park et al. | 118/719 |
| 5,981,404 | 11/1999 | Sheng et al. | 438/791 |

*Primary Examiner*—Brian Dutton
*Attorney, Agent, or Firm*—Myers Bigel Sibley & Sajovec

[57] ABSTRACT

Methods of forming integrated circuit capacitors having composite oxide-nitride-oxide (ONO) dielectric layers include the steps of forming a first electrically insulating layer on a semiconductor substrate and then forming a first conductive layer on the first electrically insulating layer. The first conductive layer and the first electrically insulating layer are then etched in sequence to define an opening in the first conductive layer which exposes upper and lower surfaces of the first conductive layer extending adjacent the opening. The exposed upper and lower surfaces of the first conductive layer are then cleaned to remove a native oxide film therefrom. A preferred composite dielectric layer is then formed on the first conductive layer. The composite dielectric layer comprises a first oxide layer which contacts the cleaned upper and lower surfaces of the first conductive layer, a nitride layer which contacts the first oxide layer and a second oxide layer which contacts the nitride layer. A step is then performed to form a second conductive layer on the composite dielectric layer. Here, the step of forming a composite dielectric layer includes the step of exposing the first conductive layer to an oxygen containing atmosphere. Preferably, the cleaned upper and lower surfaces of the first conductive layer are exposed to an atmosphere containing 30–100% oxygen by weight and 0–70% nitrogen by weight.

15 Claims, 5 Drawing Sheets

METHODS AND APPARATUS FOR FORMING INTEGRATED CIRCUIT CAPACITORS HAVING COMPOSITE OXIDE-NITRIDE-OXIDE DIELECTRIC LAYERS THEREIN

FIELD OF THE INVENTION

The present invention relates to integrated circuit manufacturing methods and apparatus and more particularly to methods and apparatus for forming integrated circuits having composite insulating layers therein.

BACKGROUND OF THE INVENTION

Among semiconductor memory devices, DRAM devices are constructed in such a manner that a plurality of unit memory cells are formed on a semiconductor wafer. The unit memory cells typically comprise a single capacitor and a single access transistor. As will be understood by those skilled in the art, the capacitor stores electrical charges and the access transistor enables the controlled reading and writing of the charges as the binary logic state of the memory cell.

The demand for increased integration of memory devices typically requires the formation of memory cells having small unit cell size. But, it is typically difficult to manufacture capacitors having sufficient capacitance when steps to increase integration typically involve reducing the lateral dimensions of all portions of a memory device including the capacitors. To address this difficulty, attempts have been made to reduce the thickness of a capacitor's dielectric layer, form capacitor electrodes in three-dimensions and use dielectric materials which have higher dielectric constants. Capacitors having dielectric layers formed of nitride or nitride and oxide (i.e., N—O) have been considered.

A semiconductor capacitor having a nitride film as a dielectric is shown in FIG. 1. The capacitor is constructed in such a manner that a lower electrode 4 (i.e., storage electrode) is formed on a silicon substrate 1 over which an insulating film 2 and a high temperature oxide film 3 are deposited in sequence. A nitride film 5, which is very thin, is formed on the surface of the lower electrode 4 using LPCVD (Low Pressure Chemical Vapor Deposition) and an oxide film 6 is formed over the nitride film 5 by performing a heating and oxidation step inside a diffusion furnace. A phosphorus doped polysilicon film is then formed as an upper electrode 7 over the composite dielectric film. Here, the method and apparatus for forming the nitride film 5 has been developed so that a very thin and uniform nitride film can be formed over a lower electrode 4, and the formation of a native oxide film on the lower electrode 4 can be prevented. In particular, prior to formation of the nitride film 5, the surface of the lower electrode 4 is cleaned using a wet-cleaning method and a diluted hydrofluoric acid solution in sequence. The nitride film 5 is then deposited immediately following the removal of the native oxide film. However, integrated circuit capacitors having a composite dielectric structure formed in accordance with the above conventional method may be susceptible to leakage currents when a voltage is applied thereto because the nitride film may be susceptible to voltage breakdown.

The apparatus for manufacturing the semiconductor capacitor having the above nitride film 5 as a dielectric is illustrated in FIG. 2. The apparatus comprises a processing chamber 11 and a loadlock chamber 12. Before processing wafers inside the processing chamber 11, a boat, which is loaded with wafers, is introduced into the loadlock chamber 12. Then, the loadlock chamber 12 is sealed and then nitrogen is supplied to the chamber 12 through a nitrogen feed line 13 equipped with a flow regulator 14 and a cut-off valve 15. Accordingly, a nitrogen atmosphere is established inside the loadlock chamber 12. Next, internal atmosphere air (including oxygen and potential contaminants) is exhausted by driving a vacuum pump 16 connected with the loadlock chamber 12. The boat loaded with semiconductor wafers is then transferred to the processing chamber 11 for subsequent processing. A nitride film 5 being relatively thin and uniform is then formed over the lower electrode 4, in the processing chamber 11.

In the event the nitride film 5 is formed by using only processing chamber 11 without applying the loadlock chamber 12, the processing chamber 11 is first preheated to a temperature in a range of 600 to 800° C. Therefore, while the boat loaded with the wafers is transferred into the preheated processing chamber 11, the upper wafers on the boat are first heated and a native oxide film having a thickness of about 4 Å is formed on the upper wafers. However, the wafers located in the middle and lower portions of the boat do not receive well-formed native oxide films because of an oxygen deficiency. For example, the thickness of the native oxide films on the wafers in the middle and lower portions of the boat may only receive native oxide films having a thickness of about 1 Å.

Therefore, in order to solve the differences in thicknesses of the native oxide films as described above, "dummy" wafers are typically placed on the upper and lower sides of the boat and actual "process" wafers are placed in the middle of the boat. However, the use of "dummy" wafers results in an obvious loss of economic efficiency and wafer throughput. Thus, notwithstanding the above method, there continues to be a need for methods and apparatus that enable the formation of improved dielectric layers for integrated circuit capacitors.

SUMMARY OF THE INVENTION

It is therefore an object of the present invention to provide improved methods of forming integrated circuit capacitors.

It is another object of the present invention to provide methods of forming integrated circuit capacitors having uniform electrical characteristics across semiconductor wafers.

It is still another object of the present invention to provide apparatus for forming improved integrated circuit capacitors.

These and other objects, features and advantages of the present invention are provided by methods of forming integrated circuit capacitors which include the steps of forming a composite oxide-nitride-oxide (ONO) layer as a capacitor dielectric in a preferred manner so that the electrical properties of the capacitors can be uniformly established across a semiconductor wafer. In particular, preferred methods include the steps of forming a first electrically insulating layer on a semiconductor substrate and then forming a first conductive layer on the first electrically insulating layer. The first conductive layer and the first electrically insulating layer are then etched in sequence to define an opening in the first conductive layer which exposes upper and lower surfaces of the first conductive layer extending adjacent the opening. The exposed upper and lower surfaces of the first conductive layer are then cleaned to remove a native oxide film therefrom. A preferred composite dielectric layer is then formed on the first conductive layer. The composite dielectric layer comprises a first oxide layer which contacts the cleaned upper and lower surfaces of the first conductive layer, a nitride layer which contacts the first oxide layer and a second oxide layer which contacts the nitride layer. A step is then performed to form a second conductive layer on the composite dielectric layer.

According to a preferred aspect of the present invention, the step of forming a composite dielectric layer includes the step of exposing the first conductive layer to an oxygen containing atmosphere. Preferably, the cleaned upper and lower surfaces of the first conductive layer are exposed to an atmosphere containing 30–100% oxygen by weight and 0–70% nitrogen by weight. The step of forming the composite dielectric layer is also preferably preceded by the step of disposing the substrate in an apparatus comprising a processing chamber and a loadlock chamber. According to another preferred aspect of the present invention, the step of forming a composite dielectric layer comprises forming a first oxide layer in the loadlock chamber and then forming a nitride layer in the processing chamber while maintaining a temperature in the processing chamber at a constant value. The second oxide layer and second conductive layer are also preferably formed in the processing chamber.

According to another embodiment of the present invention, a preferred apparatus for processing semiconductor wafers is provided. This preferred apparatus includes a processing chamber, a loadlock chamber proximate the processing chamber and a vacuum exhaust line pneumatically coupled to the processing chamber and the loadlock chamber. To provide a source of oxygen and nitrogen, an oxygen feed line is also pneumatically coupled to the loadlock chamber and a nitrogen feed line is pneumatically coupled to the loadlock chamber. Preferably, a first spray nozzle is provided in the loadlock chamber and the first spray nozzle is pneumatically coupled to the oxygen feed line. In addition, a second spray nozzle is provided in the loadlock chamber and this spray nozzle is pneumatically coupled to the nitrogen feed line.

Using this apparatus and preferred methods, integrated circuit capacitors having uniformly thick dielectric layers can be formed across an entire semiconductor wafer and across multiple wafers in a semiconductor boat. These dielectric layers also possess preferred electrical characteristics including low leakage current and high breakdown voltage capability.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
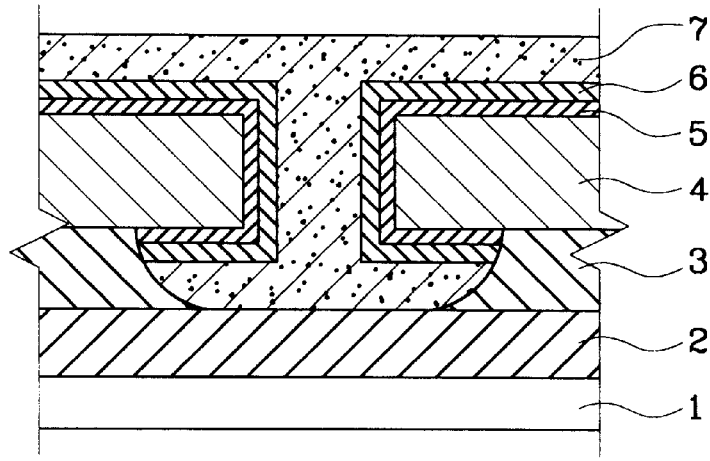
FIG. 1 is a cross-sectional illustration of an integrated circuit capacitor according to the prior art.
Figure 2:
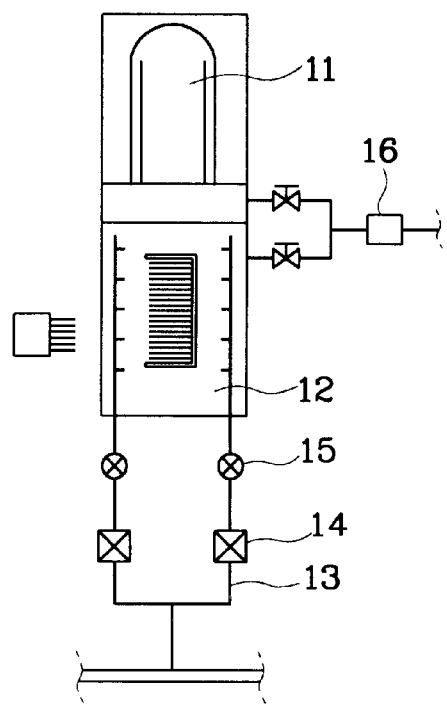
FIG. 2 is a schematic view of an apparatus for processing semiconductor wafers according to the prior art
Figure 3:
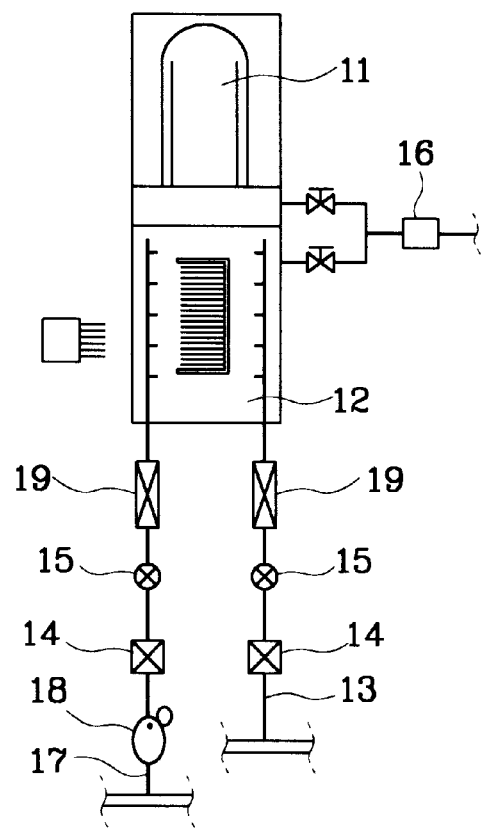
FIG. 3 is a schematic view of an apparatus for processing semiconductor wafers according to an embodiment of the present invention.

Referring now to FIG. 3, a preferred apparatus for forming an integrated circuit capacitor will be described. In particular, the preferred apparatus comprises a processing chamber 11, a loadlock chamber 12 and a vacuum pump 16 coupled to the processing chamber 11 and loadlock chamber 12. The processing chamber 11 is preferably located proximate the loadlock chamber 12 and may be mounted thereto in a vertically aligned manner as illustrated. Separate pneumatic vacuum lines may also be provided with valves to control the degree of vacuum established in the processing chamber 11 and the loadlock chamber 12 during steps to form integrated circuit capacitors on semiconductor wafers. An oxygen feed line 17 and nitrogen feed line 13 are also provided so that a pure oxygen or oxygen/nitrogen ambient can be established in a carefully controlled manner in the loadlock chamber 12. As illustrated best by FIG. 3, a pressure regulator 18, flow regulator 14, cutoff valve 15 and filter 19 are provided in series between the oxygen feed line 17 and the loadlock chamber 12. In the loadlock chamber 12, a first spray nozzle for providing oxygen may be provided. As illustrated, the first spray nozzle may extend vertically in the loadlock chamber 12 on the left side thereof. The first spray nozzle is also pneumatically coupled to the output of the filter 19. Here, the filters 19 are preferably provided for filtering out contaminants. The filters may comprise high efficiency particulate air (HEPA) filters or ultra low penetration air filters (ULPAF). A flow regulator 14, cutoff valve 15 and filter 19 are also provided in series between the nitrogen feed line 13 and a spray nozzle on a right side of the loadlock chamber 12. Thus, the amount of nitrogen provided to an interior of the loadlock chamber 12 may be carefully controlled. In particular, the oxygen and nitrogen spray nozzles are preferably placed at opposite sides of the loadlock chamber 12 to reduce the likelihood that a turbulent gas atmosphere will be established during processing. Here, the interior of the loadlock chamber 12 is illustrated as containing a boat of semiconductor wafers which may be moved vertically between the loadlock chamber 12 and the processing chamber 11. These semiconductor wafers may comprises partially processed semiconductor wafers. As described more fully hereinbelow, oxide films may be established on the semiconductor wafers by loading the boat into the loadlock chamber 12 and then exposing the wafers to a preferred oxygen containing ambient. The boat of wafers may then be transferred to the processing chamber 11 so that additional nitride and oxide films can be deposited in a carefully controlled manner.

Figure 4:
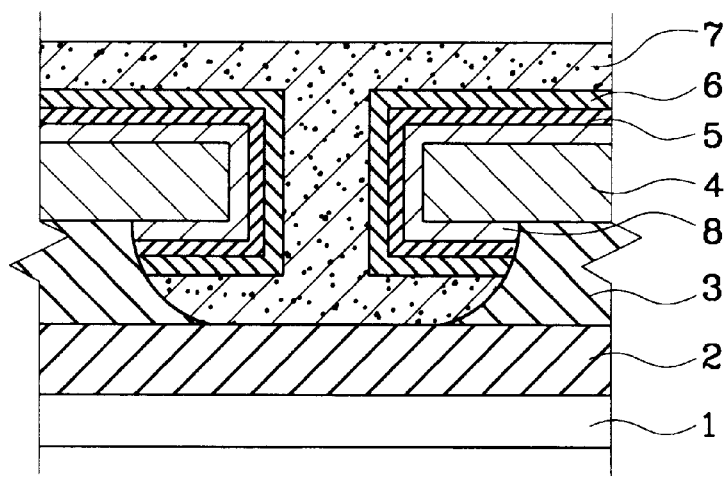
FIG. 4 is a cross-sectional illustration of an integrated circuit capacitor formed in a preferred manner using the apparatus of FIG. 3.

Referring now to FIGS. 3 and 4, preferred methods of forming integrated circuit capacitors include the steps of forming an electrically insulating layer 2 on a semiconductor substrate 1. A high temperature oxide (HTO) layer 3 may also be established on the electrically insulating layer 2. A layer of conductive material may then be formed on the HTO layer 3. The layer of conductive material may comprise polycrystalline or amorphous silicon, for example. A photolithographically defined etching step may then be performed to pattern a lower capacitor electrode 4. During this etching step, a portion of the HTO layer 3 may also be etched to define an undercut region so that both lower and upper surfaces of the lower capacitor electrode 4 are exposed.

According to a first embodiment of the present invention, after the lower capacitor electrode 4 is patterned, a cleaning step is preferably performed using a cleaning solution to remove, among other things, any native oxide film formed on the exposed surfaces of the lower capacitor electrode 4. Next, a first oxide layer 8 having a predetermined thickness is formed on the lower capacitor electrode 4 by exposing the lower capacitor electrode 4 to an oxygen containing ambient. Here, the percentage of oxygen in the oxygen containing ambient can be precisely controlled by proper regulation of the cutoff valve 15, flow regulator 14 and pressure regulator 18 which are pneumatically coupled in series between the oxygen feed line 17 and the left side spray nozzle located internal to the loadlock chamber 12. A nitride layer 5 is then formed on the first oxide layer 8. Next, a second oxide layer 6 is formed on the nitride layer 5 to complete the composite dielectric layer of the capacitor. As determined by the inventors herein, the formation of a composite dielectric layer as an oxide-nitride-oxide (ONO) composite layer improves the dielectric, current leakage and voltage breakdown properties of capacitors formed therefrom. After the capacitor dielectric layer has been formed, an upper capacitor electrode 7 is formed on the second oxide layer 6. As illustrated best by FIG. 4, the upper capacitor electrode 7 extends into the undercut region so that the effective surface area of the capacitor can be maintained at a high level.

According to a preferred aspect of the present invention, the rate at which the first oxide layer 8 is formed can be controlled by controlling the percentage of oxygen in an oxygen/nitrogen ambient established in the loadlock chamber 12 during the step of forming the first oxide layer 8. Here, the oxygen/nitrogen ambient is preferably established to have concentrations of 1–100% by weight oxygen and a 99–0% by weight nitrogen. More preferably, the weight percent of oxygen should be in a range between 30 and 100% and the weight percent of nitrogen should be in a range between 70 an 0%.

According to another embodiment of the present invention, the loadlock chamber 12 is supplied with a boat of semiconductor wafers and then the loadlock chamber 12 is evacuated. Here, a pure nitrogen ambient may be established in the loadlock chamber 12 before it is evacuated using the vacuum pump 16. The first oxide layer 8 is then formed on the lower capacitor electrode 4 by establishing a preferred oxygen/nitrogen ambient in the loadlock chamber 12. The first oxide layer 8 is preferably formed to have a thickness in a range between about 2 and 6 Å. Then, upon completion of the step to form the first oxide layer 8, the boat of semiconductor wafers is transferred to the processing chamber 11. The nitride layer 5, second oxide layer 6 and upper capacitor electrode 7 are then formed. Preferably, the temperature in the processing chamber 11 is kept constant.

Figure 5:
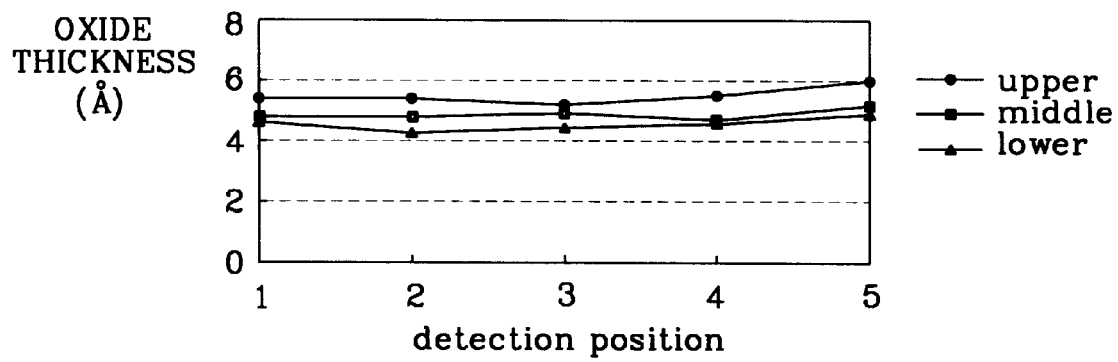
FIG. 5 illustrates graphs of oxide layer thickness versus semiconductor wafer surface location, for wafers located at various positions in a semiconductor boat, according to a first comparative example of the present invention.

To illustrate the preferred electrical and physical characteristics of capacitors formed in accordance with the present invention, comparisons were made between various embodiments of the present invention and conventional methods of forming integrated circuit capacitors. According to a first comparative example of the present invention, a boat of wafers were loaded into the loadlock chamber 12 and a pure nitrogen ambient was established therein. The nitrogen ambient was then evacuated and the pressure inside the loadlock chamber 12 was reduced to $10^{-3}$ torr. Next, 20 liters of pure oxygen were passed through the loadlock chamber 12 during the step of forming a first thermal oxide layer 8. The results of this comparative example are illustrated by TABLE 1 and FIG. 5. Here, TABLE 1 illustrates the range of thicknesses of the first oxide layer 8 at five (5) locations on a semiconductor wafer, for wafers located in the upper, middle and lower portions of the boat. FIG. 5 illustrates graphs of oxide thickness versus location based on the data contained in TABLE 1.

TABLE 1

| | Comparative Example No. 1 | | |
|---|---|---|---|
| Position | Position Within Boat | | |
| on Surface | upper | middle | lower |
| 1 | 5.40Å | 4.80Å | 4.77Å |
| 2 | 5.31Å | 4.73Å | 4.29Å |
| 3 | 5.02Å | 4.89Å | 4.42Å |
| 4 | 5.52Å | 4.62Å | 4.79Å |
| 5 | 5.98Å | 5.21Å | 5.09Å |
| average | 5.45Å | 4.85Å | 4.67Å |

Figure 6:
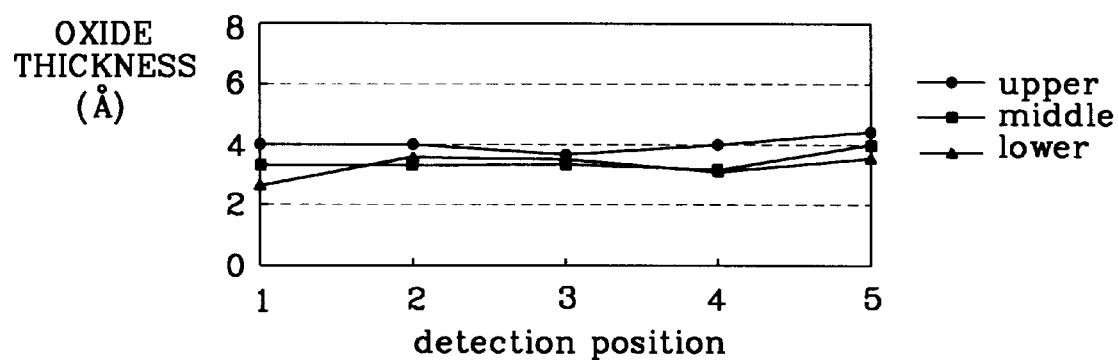
FIG. 6 illustrates graphs of oxide layer thickness versus semiconductor wafer surface location, for wafers located at various positions in a semiconductor boat, according to a second comparative example of the present invention.

According to a second comparative example of the present invention, a mixture of oxygen and nitrogen was established in the loadlock chamber 12. In particular, a 1-to-3 volumetric ratio of oxygen to nitrogen was established in the loadlock chamber during the step of forming the first oxide layer 8. The results of this comparative example are illustrated by TABLE 2 and FIG. 6. Here, TABLE 2 illustrates the range of thicknesses of the first oxide layer 8 at five (5) locations on a semiconductor wafer, for wafers located in the upper, middle and lower portions of the boat. FIG. 6 illustrates graphs of oxide thickness versus location based on the data contained in TABLE 2.

TABLE 2

| | Comparative Example No. 2 | | |
|---|---|---|---|
| | Position Within Boat | | |
| Position | upper | middle | lower |
| 1 | 4.52Å | 4.12Å | 3.95Å |
| 2 | 4.95Å | 3.78Å | 3.89Å |
| 3 | 4.87Å | 4.25Å | 3.76Å |
| 4 | 4.89Å | 3.75Å | 4.08Å |

TABLE 2-continued

Comparative Example No. 2

| | Position Within Boat | | |
|---|---|---|---|
| Position | upper | middle | lower |
| 5 | 5.12Å | 4.28Å | 4.30Å |
| average | 4.87Å | 4.04Å | 4.00Å |

Figure 7:
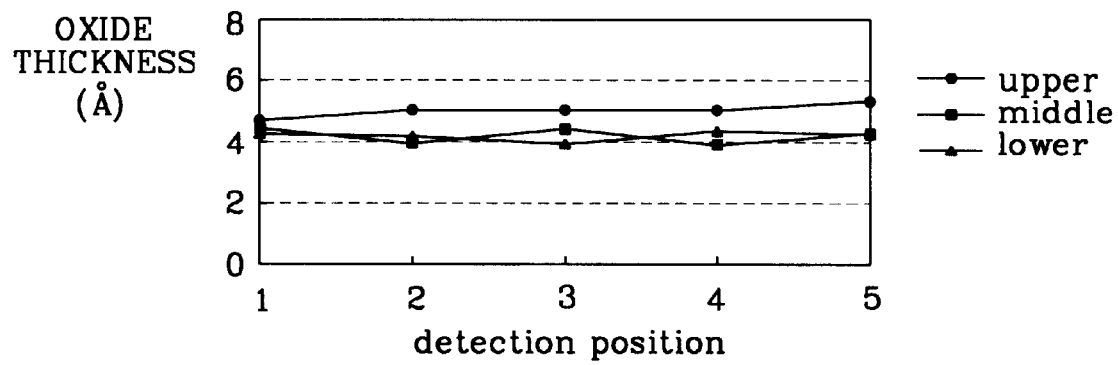
FIG. 7 illustrates graphs of oxide layer thickness versus semiconductor wafer surface location, for wafers located at various positions in a semiconductor boat, according to a third comparative example of the present invention.

According to a third comparative example of the present invention, a mixture of oxygen and nitrogen was established in the loadlock chamber 12. In particular, a 1-to-1 volumetric ratio of oxygen to nitrogen was established in the loadlock chamber during the step of forming the first oxide layer 8. The results of this comparative example are illustrated by TABLE 3 and FIG. 7. Here, TABLE 3 illustrates the range of thicknesses of the first oxide layer 8 at five (5) locations on a semiconductor wafer, for wafers located in the upper, middle and lower portions of the boat. FIG. 7 illustrates graphs of oxide thickness versus location based on the data contained in TABLE 3.

TABLE 3

Comparative Example No. 3

| | Position Within Boat | | |
|---|---|---|---|
| Position | upper | middle | lower |
| 1 | 4.09Å | 3.15Å | 2.98Å |
| 2 | 3.98Å | 3.25Å | 3.52Å |
| 3 | 3.86Å | 3.46Å | 3.56Å |
| 4 | 4.01Å | 3.29Å | 3.29Å |
| 5 | 4.39Å | 3.91Å | 3.46Å |
| average | 4.07Å | 3.41Å | 3.36Å |

Figure 8:
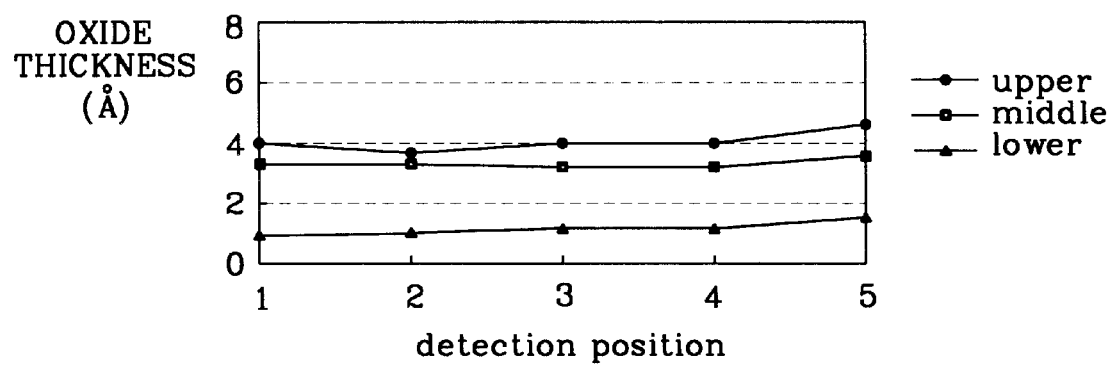
FIG. 8 illustrates graphs of oxide layer thickness versus semiconductor wafer surface location, for wafers located at various positions in a semiconductor boat, according to a fourth comparative example of the prior art.

According to a fourth comparative example of the prior art, a preferred mixture of oxygen and nitrogen was not established in the loadlock chamber 12. Instead, atmospheric air was used as the ambient during the step of forming the first oxide layer 8. The results of this comparative example are illustrated by TABLE 4 and FIG. 8. In particular, TABLE 4 illustrates the range of thicknesses of the first oxide layer 8 at five (5) locations on a semiconductor wafer, for wafers located in the upper, middle and lower portions of the boat. FIG. 8 illustrates graphs of oxide thickness versus location based on the data contained in TABLE 4.

TABLE 4

Comparative Example No. 4

| | Position Within Boat | | |
|---|---|---|---|
| Position | upper | middle | lower |
| 1 | 4.16Å | 3.15Å | 1.06Å |
| 2 | 3.59Å | 3.01Å | 1.09Å |
| 3 | 4.01Å | 2.85Å | 1.23Å |
| 4 | 3.98Å | 2.89Å | 0.95Å |
| 5 | 4.58Å | 3.21Å | 1.82Å |
| average | 4.06Å | 3.02Å | 1.23Å |

Figure 9:
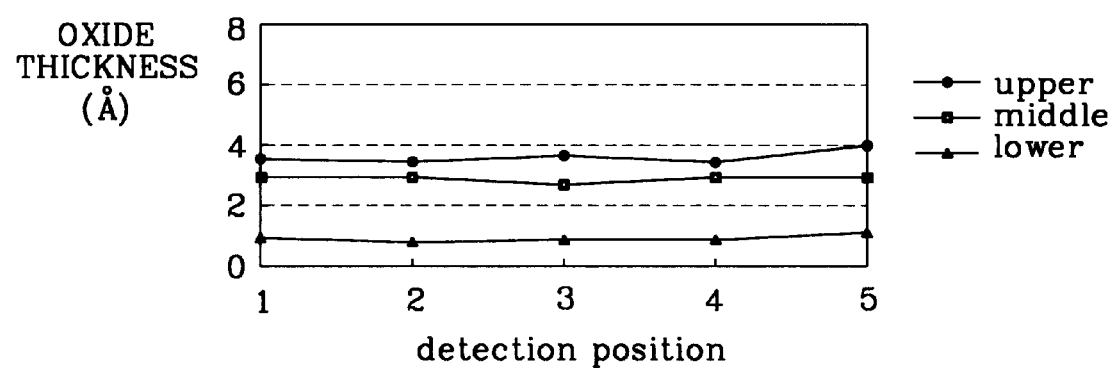
FIG. 9 illustrates graphs of oxide layer thickness versus semiconductor wafer surface location, for wafers located at various positions in a semiconductor boat, according to a fifth comparative example of the prior art.

According to a fifth comparative example of the prior art, a preferred mixture of oxygen and nitrogen was not established in the loadlock chamber 12. Instead, 20 liters of pure nitrogen were supplied to the loadlock chamber 12 during the step of forming the first oxide layer 8. The results of this comparative example are illustrated by TABLE 4 and FIG. 9. In particular, TABLE 5 illustrates the range of thicknesses of the first oxide layer 8 at five (5) locations on a semiconductor wafer, for wafers located in the upper, middle and lower portions of the boat. FIG. 9 illustrates graphs of oxide thickness versus location based on the data contained in TABLE 5.

TABLE 5

Comparative Example No. 5

| | Position Within Boat | | |
|---|---|---|---|
| Position | upper | middle | lower |
| 1 | 3.56Å | 3.02Å | 1.02Å |
| 2 | 3.39Å | 3.01Å | 0.85Å |
| 3 | 3.51Å | 2.59Å | 0.98Å |
| 4 | 3.29Å | 2.98Å | 0.86Å |
| 5 | 3.86Å | 3.21Å | 1.23Å |
| average | 3.52Å | 2.96Å | 0.99Å |

As illustrated by TABLES 1–3 and FIGS. 5–7, the first oxide films 8 formed in accordance with the present invention are substantially more uniform in thickness than the corresponding oxide films formed in an atmospheric air ambient or pure nitrogen ambient, as illustrated by TABLES 4–5 and FIGS. 8–9.

Figure 10:
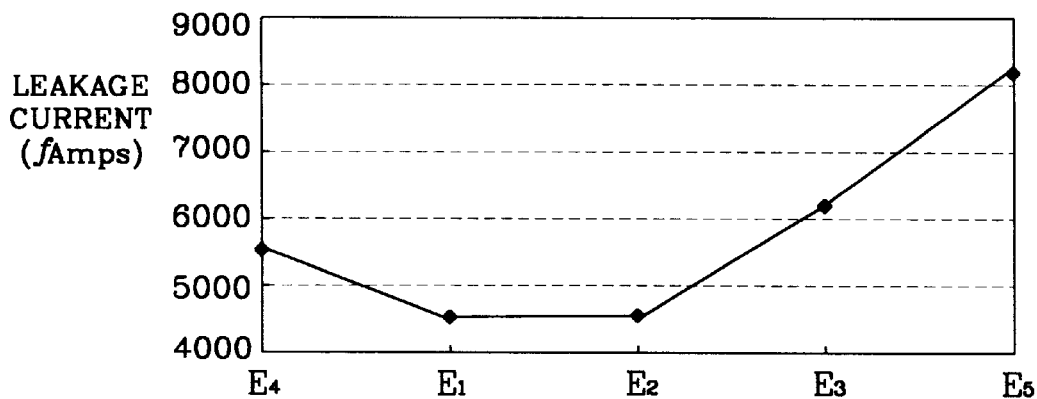
FIG. 10 illustrates a graph of leakage current measurements for each of the first through fifth comparative examples ($E_1$–$E_5$).
Figure 11:
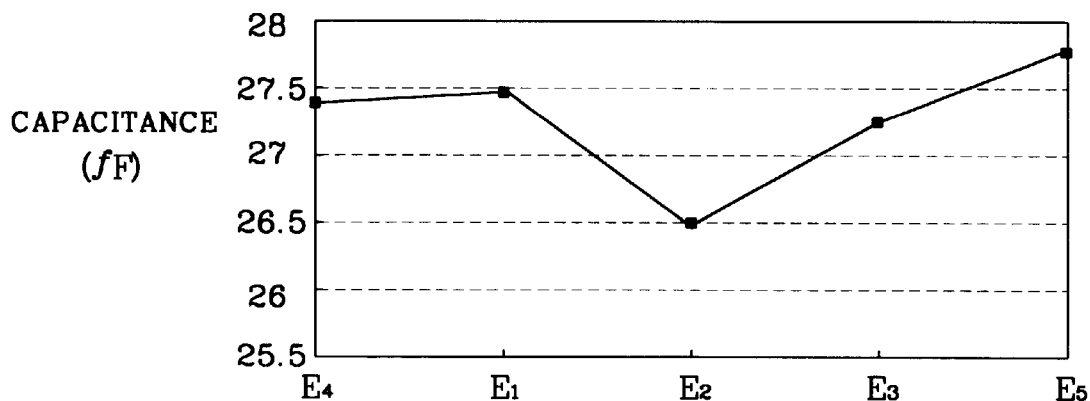
FIG. 11 illustrates a graph of capacitance for each of the first through fifth comparative examples ($E_1$–$E_5$).
Figure 12:
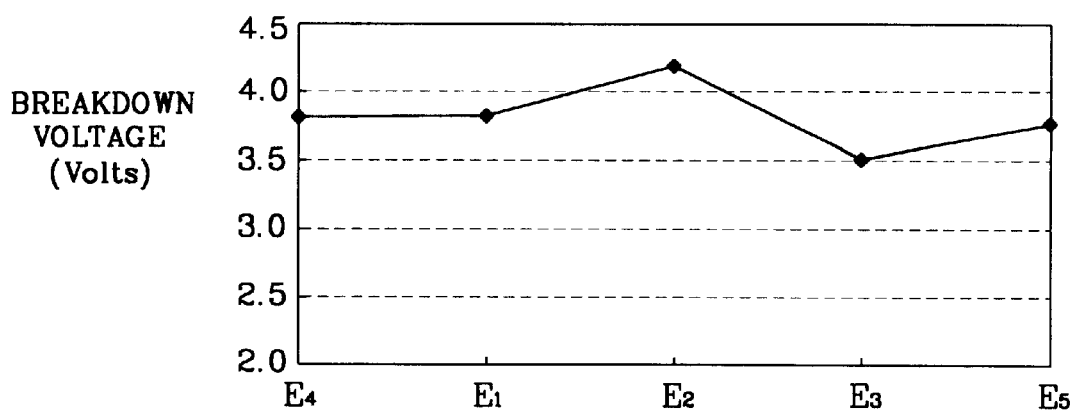
FIG. 12 illustrates a graph of breakdown voltage for each of the first through fifth comparative examples ($E_1$–$E_5$).

As illustrated best by TABLE 6, measurements of electrical properties including leakage current, capacitance and breakdown voltage, were performed on capacitors formed in accordance with the above described comparative examples of TABLES 1–5. These measurements are also illustrated by FIGS. 10–12. In particular, FIG. 10 illustrates a graph of leakage current measurements, FIG. 11 illustrates a graph of capacitance and FIG. 12 illustrates a graph of breakdown voltage.

TABLE 6

| | | Leakage Current (f Amps) | Minimum Capacitance (fF) | Maximum Capacitance (fF) | Breakdown Voltage (V) |
|---|---|---|---|---|---|
| Example No. 1 ($E_1$) | upper | 4,197 | 26.71 | 26.71 | 3.40 |
| | middle | 7,358 | 27.97 | 27.99 | 3.97 |
| | lower | 5,174 | 27.42 | 27.43 | 4.07 |
| | average | 5,576.3 | 27.37 | 27.38 | 3.80 |
| Example No. 2 ($E_2$) | upper | 3,378 | 27.15 | 27.15 | 3.31 |
| | middle | 4,766 | 27.47 | 27.48 | 4.10 |
| | lower | 5,453 | 27.76 | 27.78 | 4.04 |
| | average | 4,532.3 | 27.46 | 27.47 | 3.82 |
| Example No. 3 ($E_3$) | upper | 2,059 | 26.22 | 26.23 | 4.35 |
| | middle | 8,525 | 26.96 | 26.98 | 3.99 |
| | lower | 3,240 | 26.12 | 26.13 | 4.25 |
| | average | 4,608.0 | 26.43 | 26.45 | 4.20 |
| Example No. 4 ($E_4$) | upper | 3,037 | 26.87 | 26.88 | 2.53 |
| | middle | 10,400 | 27.74 | 27.76 | 3.79 |
| | lower | 5,272 | 27.18 | 27.19 | 4.06 |
| | average | 6,236.3 | 27.26 | 27.28 | 3.46 |
| Example No. 5 ($E_5$) | upper | 4,222 | 26.81 | 26.81 | 4.13 |
| | middle | 6,666 | 27.86 | 27.87 | 3.99 |
| | lower | 13,840 | 28.71 | 28.72 | 3.04 |
| | average | 8242.7 | 27.79 | 27.80 | 3.72 |

As illustrated by TABLE 6, the leakage currents associated with the first oxide films 8 formed in accordance with the present invention are small, the values of minimum and maximum capacitance are uniform and the breakdown voltages are high. Thus, high quality oxide films 8 and composite dielectric layers can be formed using the processing steps associated with the present invention.

In the drawings and specification, there have been disclosed typical preferred embodiments of the invention and, That which is claimed is:

1. A method of forming an integrated circuit capacitor, comprising the steps of:

forming a first capacitor electrode on a substrate;

cleaning a surface of the first capacitor electrode;

forming a composite dielectric layer on the first capacitor electrode, said composite dielectric layer comprising a first oxide layer that is formed by exposing the cleaned surface of the first capacitor electrode to an oxygen containing atmosphere, a nitride layer on the first oxide layer and a second oxide layer on the nitride layer; and forming a second capacitor electrode on the composite dielectric layer, opposite the first capacitor electrode.

2. The method of claim 1, wherein said cleaning step comprises cleaning a surface of the first capacitor electrode to remove a native oxide film therefrom.

3. The method of claim 1, wherein said step of forming a composite dielectric layer comprises exposing the first capacitor electrode to an atmosphere containing 30 to 100% oxygen by weight and 0 to 70% nitrogen by weight.

4. The method of claim 3, wherein said step of forming a composite dielectric layer comprises forming the first oxide layer on the cleaned surface by exposing the first capacitor electrode to an atmosphere containing only oxygen and nitrogen.

5. The method of claim 1, wherein said step of forming a composite dielectric layer is preceded by the step of disposing the substrate in an apparatus comprising a processing chamber and a loadlock chamber; and wherein said step of forming a composite dielectric layer comprises forming a first oxide layer in the loadlock chamber and then forming a nitride layer in the processing chamber.

6. The method of claim 5, wherein said step of forming a nitride layer in the processing chamber comprises forming a nitride layer in the processing chamber while maintaining a temperature in the processing chamber at a constant value.

7. The method of claim 5, wherein said step of forming a second capacitor electrode comprises forming a second capacitor electrode in the processing chamber.

8. The method of claim 7, wherein said step of forming a composite dielectric layer comprises forming a second oxide layer in the processing chamber.

9. A method of forming an integrated circuit capacitor, comprising the steps of:

forming a first electrically insulating layer on a semiconductor substrate;

forming a first conductive layer on the first electrically insulating layer;

etching the first conductive layer and first electrically insulating layer in sequence to define an opening in the first conductive layer which exposes upper and lower surfaces of the first conductive layer extending adjacent the opening;

cleaning the exposed upper and lower surfaces of the first conductive layer to remove a native oxide film therefrom;

forming a composite dielectric layer on the first conductive layer, said composite dielectric layer comprising a first oxide layer on the cleaned upper and lower surfaces of the first conductive layer, a nitride layer on the first oxide layer and a second oxide layer on the nitride layer; and forming a second conductive layer on the composite dielectric layer; and wherein said step of forming a composite dielectric layer comprises exposing the cleaned upper and lower surfaces of the first conductive layer to an atmosphere containing 30 to 100% oxygen by weight and 0 to 70% nitrogen by weight.

10. The method of claim 9, wherein said step of forming a composite dielectric layer comprises exposing the cleaned upper and lower surfaces of the first conductive layer to an atmosphere containing only oxygen and nitrogen.

11. The method of claim 9, wherein said step of forming a composite dielectric layer is preceded by the step of disposing the substrate in an apparatus comprising a processing chamber and a loadlock chamber; and wherein said step of forming a composite dielectric layer comprises forming a first oxide layer in the loadlock chamber and then forming a nitride layer in the processing chamber.

12. The method of claim 11, wherein said step of forming a nitride layer in the processing chamber comprises forming a nitride layer in the processing chamber while maintaining a temperature in the processing chamber at a constant value.

13. The method of claim 11, wherein said step of forming a second conductive layer comprises forming a second conductive layer in the processing chamber.

14. The method of claim 13, wherein said step of forming a composite dielectric layer comprises forming a second oxide layer in the processing chamber.

15. A method of forming an integrated circuit capacitor, comprising the steps of:

forming a first electrically insulating layer on a semiconductor substrate;

forming a first conductive layer on the first electrically insulating layer;

etching the first conductive layer and first electrically insulating layer in sequence to define an opening in the first conductive layer which exposes upper and lower surfaces of the first conductive layer extending adjacent the opening;

cleaning the exposed upper and lower surfaces of the first conductive layer to remove a native oxide film therefrom;

forming a composite dielectric layer on the first conductive layer by exposing the first conductive layer to an atmosphere containing only 1 to 100% oxygen by weight and 0 to 99% nitrogen by weight, said composite dielectric layer comprising a first oxide layer on the cleaned upper and lower surfaces of the first conductive layer, a nitride layer on the first oxide layer and a second oxide layer on the nitride layer; and forming a second conductive layer on the composite dielectric layer.

* * * * *